United States Patent [19]

Arldt et al.

[11] Patent Number: 4,970,579
[45] Date of Patent: Nov. 13, 1990

[54] INTEGRATED CIRCUIT PACKAGE WITH IMPROVED COOLING MEANS

[75] Inventors: Brian D. Arldt, Austin; Peter H. Bruhn, Georgetown; M. Lawrence Buller, Austin, all of Tex.; Peter G. Ledermann, Pleasantville, N.Y.; Stephen D. Linam, Round Rock; Barbara J. McNelis, Austin, both of Tex.; Lawrence S. Mok; Paul A. Moskowitz, both of Yorktown Heights, N.Y.

[73] Assignee: International Business Machines Corp., Armonk, N.Y.

[21] Appl. No.: 247,149

[22] Filed: Sep. 21, 1988

[51] Int. Cl.$^5$ .......................................... H01L 23/02
[52] U.S. Cl. ...................................................... 357/81
[58] Field of Search ................................ 357/81, 80, 79

[56] References Cited

U.S. PATENT DOCUMENTS

| | | | |
|---|---|---|---|
| 3,187,812 | 6/1965 | Staver | 165/185 |
| 4,132,856 | 1/1979 | Hutchison et al. | 174/52 PE |
| 4,147,889 | 4/1979 | Andrews et al. | 174/52 FP |
| 4,209,798 | 6/1980 | Beretta | 357/70 |
| 4,235,285 | 11/1980 | Johnson et al. | 357/81 |
| 4,259,436 | 3/1981 | Tabuchi et al. | 430/314 |
| 4,259,685 | 3/1981 | Romano | 357/81 |
| 4,261,005 | 4/1981 | McCarthy | 357/81 |
| 4,283,839 | 8/1981 | Gursky | 29/589 |
| 4,396,936 | 8/1983 | Melver et al. | 357/81 |
| 4,417,267 | 11/1983 | Wada et al. | 357/81 |
| 4,421,161 | 12/1983 | Romania et al. | 165/80 C |
| 4,442,450 | 4/1984 | Lipschutz et al. | 357/81 |
| 4,446,504 | 5/1984 | Jordon et al. | 357/81 |
| 4,459,607 | 7/1984 | Reid | 357/71 |
| 4,479,140 | 10/1984 | Horvath | 357/81 |
| 4,481,525 | 11/1984 | Calabro et al. | 357/81 |
| 4,588,028 | 5/1986 | Marshall et al. | 357/81 |
| 4,593,342 | 6/1986 | Lindsay | 357/81 |
| 4,609,040 | 9/1986 | Moore | 165/80.3 |
| 4,611,238 | 9/1986 | Lewis et al. | 357/81 |
| 4,849,856 | 7/1989 | Funari et al. | 357/81 |

FOREIGN PATENT DOCUMENTS 5546572 9/1978 Japan .

OTHER PUBLICATIONS

Bleher et al., "Electronic Packaging", vol. 12, No. 5, Oct. 1969, p. 727, IBM Technical Disclosure Bulletin.
H. Parsapour, "Modular Heat Sink", IBM Technical Disclosure Bulletin, vol. 17, No. 11, Apr. 1975, p. 3313.
R. C. Chu et al., "Heat Sinl", IBM Technical Disclosure Bulletin, vol. 17, No. 12, May 1975, pp. 3656-3657.
E. G. Loeffel et al., "Liquid Cooled Module With Complian Membrane", IBM Technical Disclosure Bulletin, vol. 20, No. 2, Jul. 1977, pp. 673-674.
E. E. Zirnis, "Semiconductor Module with Improved Air Cooling", IBM Technical Disclosure Bulletin, vol. 20, No. 5, Oct. 1977, p. 1768.
E. L. Bombroski et al., "Thermal Conduction Module", IBM Technical Disclosure Bulletin, vol. 20, No. 6, Nov. 1977, pp. 2214-2215.

(List continued on next page.)

Primary Examiner—John D. Lee
Assistant Examiner—Robert E. Wise
Attorney, Agent, or Firm—Perman & Green

[57] ABSTRACT

An integrated circuit chip package is described wherein the chip has an active face including a plurality of input and output pads. The chip is mounted face down on a pluralilty of flexible inner beam leads. The package's outer beam leads are bonded to pads residing on an underlying circuit board. A convective heat sink is thermally mounted to the reverse face of the chip, which heat sink is formed from folded thin metal sheet. The heat sink exhibits both minimum mass, and optimum cooling efficiency. The minimum mass reduces the cost of the heat sink through material savings and minimizes the possibility of damage to the package caused by sudden acceleration. The heat sink, in addition to itself being somewhat flexible, is provided with mounting points which are physically connected to the underlying circuit board via resilient connecting means.

11 Claims, 3 Drawing Sheets

OTHER PUBLICATIONS

H. Eckenbach et al., "Semiconductor Module with Heat Transfer", IBM Technical Disclosure Bulletin, vol. 20, No. 12, May 1978, p. 5203.

H. A. Goodman, "Intramodular Thermal Shunt", IBM Technical Disclosure Bulletin, vol. 21, No. 3, Aug. 1978, pp. 1141–1142.

F. E. Andros et al., "One-Piece Snap-On Heat Sing", IBM Technical Disclosure Bulletin, vol. 22, No. 1, Jun. 1979, pp. 71–72.

J. L. Horvath, "Sheet Metal Cooling Fin Structure", IBM Technical Disclosure Bulletin, vol. 23, No. 5, Oct. 1980, pp. 1919–1920.

S. W. Nutter et al., "Center-Post Heat Sink", IBM Technical Disclosure Bulletin, vol. 23, No. 9, Feb. 1981, pp. 4222–4223.

M. L. Buller et al., "Dendritic Heat Sink", IBM Technical Disclosure Bulletin, vol. 23, No. 11, Apr. 1981, p. 4853.

Swindal, "Impact Packaging Technique", IBM Technical Disclosure Bulletin, vol. 27, No. 3, Aug. 1984, pp. 1634–1635.

M. Grandguillot et al., "New Coating for Radial Finger Cooling", IBM Technical Bulletin, vol. 28, No. 12, May 1986, p. 5504.

Curtis et al., "Surface Mount Chip Packaging", IBM Technical Disclosure Bulletin, vol. 28, No. 12, May 1986, pp. 5531–5532.

INTEGRATED CIRCUIT PACKAGE WITH IMPROVED COOLING MEANS

CROSS REFERENCE TO RELATED INVENTION

Reference is hereby made to co-pending U.S. patent application Ser. No. 07/218,726 filed July 13, 1988 now U.S. Pat. No. 4,849,856 to Funari et al and assigned to the same assignee as this application.

FIELD OF THE INVENTION

This invention relates to integrated circuit chip packages and more particularly to integrated circuit chip packages with improved cooling means.

BACKGROUND OF THE INVENTION

The prior art is replete with various package configurations for semiconductor chips. In recent years, the cost of such packages has, in many cases, outdistanced the cost of the chips. To overcome this cost problem, a technique known as Tape Automated Bonding (TAB) packaging has come into being and it is especially useful with lower cost, low power dissipation integrated circuits. TAB packaging involves the use of a web of material, generally called a carrier tape, to carry electrically conductive leads which provide connections between the chip and the outside world. The carrier tape is incremented past a number of operating stations, one of which places a chip on an inner cluster of the conductive leads, which inner cluster is then bonded to connecting pads on the chip. The tape is then incremented to a station where the active face of the chip, including the inner lead bonds may be coated with a passivating material. The tape is then moved to a further station where the outer cluster of leads on the carrier tape is severed from the tape. The tape/chip combination is then registered with conductive pads residing on an underlying circuit board and the outer leads are bonded to the conductive pads. The circuit board-chip combination is then available for further processing.

TAB packaging is, by its nature, inexpensive. Its use has been mainly restricted to low power dissipation circuits as it is quite difficult to apply heat sinks to a TAB package structure. The main (and often only) physical interconnection between a chip and an underlying circuit board in a TAB package is via bonds between the tape-carried outer leads and the underlying conductive pads on the circuit board. To attach a cast or extruded heat sink to the chip in a TAB package is impractical as, in the event of mechanical vibration or strain, the chip will tend to pull away from the circuit board and the exerted forces may exceed the rupture strength of the lead bonds or the tape itself.

The prior art has attempted to solve the heat dissipation problems inherent with TAB packages via a number of routes. U.S. Pat. No. 4,459,607 to Reid attempts to solve the problem by emplacing the chip "back down" on a metal base plate causing the chip to be configured in a face-up orientation. One problem with this arrangement is that it calls for the use of a double metal clad plastic carrier rather than a less expensive single metal clad carrier. Furthermore, Reid suggests that the chip with its metal backing be emplaced so that the metal backing is flush with the underlying circuit board to enable the board to provide a more extensive heat sink capability. This configuration results in a relatively long thermal path before convective cooling is encountered. In other words, if the semiconductor junctions within the chip overheat, that heat must first be transferred from the chip to the underlying metal base and thence into a thermally conductive substrate where, finally, it is available to be dissipated via convective or forced air flow. Ideally, the metal heat dissipator should, itself, be subjected to convective air flow for cooling purposes.

In U.S. Pat. No. 4,396,936 to McIver et al, a chip is mounted face down on a substrate in which there is formed a plurality of thermal passages. A thermally conductive material fills the passages and provides heat dissipating pathways for chip-developed heat. This technique suffers from the same problem which besets Reid, (i.e., a long thermal pathway).

While much of the heat sink prior art shows the use of extruded aluminum or copper heat sinks of some substantial mass, other prior art shows the use of relatively thin sheets of copper or aluminum for heat sink structures. One such arrangement is described in the Lewis et al, U.S. Pat. No. 4,611,238. Therein is described a heat sink which mounts on the top of a semi-conductor package, with a chip being disposed within the package. Here again, the problem is that a long thermal path is required before the heat can be withdrawn from the chip's structure.

Still another problem which besets heat sinks adopted for use with TAB packages is how to support them, in an inexpensive fashion, while still retaining optimum heat dissipation characteristics. Physical interconnections to supports which are separate from the underlying circuit board make removal of the circuit board difficult. Physical interconnections to the board itself create different problems. For instance, circuit boards are often subject to flexure when they are inserted or withdrawn from mating connectors, which flexure can cause rupture of inflexible physical connections to a heat sink.

The above is not to say that prior art heat dissipation methods have been insufficient when it came to their use with low power dissipating TAB packages. So long as the chips dissipated one watt or less per chip, some of the prior art techniques were acceptable. Presently however, such TAB structures are being designed to dissipate two or more watts per chip and prior art heat dissipating techniques prove insufficient — especially when attempting to cool the underlying chips by simple natural convective air flow — as contrasted to forced air flow or refrigeration.

Accordingly, it is an object of this invention to provide an improved convective heat sink for a TAB mounted chip wherein the chip's power dissipation is higher than experienced in the prior art.

It is a further object of this invention to provide a TAB mounted convective heat sink which provides a very short thermal pathway for chip cooling.

It is a still further object of this invention to provide an improved convective heat sink exhibiting a minimum mass which, even when subjected to significant accelerations and deaccelerations, avoids damage to the circuit package.

It is still another object of this invention provide an improved convective heat sink which is particularly adapted for use with circuit boards which may experience flexure.

SUMMARY OF THE INVENTION

The present invention provides an integrated circuit chip package in which is incorporated improved means for cooling the chip. The integrated circuit chip has an active face including a plurality of input and output pads. The chip is mounted on a plurality of flexible beam leads, the outer beam leads of which are bonded to pads residing on a circuit board. Convective heat sink means is thermally mounted to the back of the chip, which heat sink means is formed from a folded thin metal sheet. The heat sink means exhibits both minimum mass, and optimum cooling efficiency. The minimum mass reduces the cost of the heat sink means through material savings and minimizes the possibility of damage to the package caused by sudden accelerations. The heat sink means, in addition to itself being somewhat flexible, is provided with mounting points which are physically connected to the underlying circuit board via resilient connecting means.

DETAILED DESCRIPTION OF THE INVENTION

Figure 1:
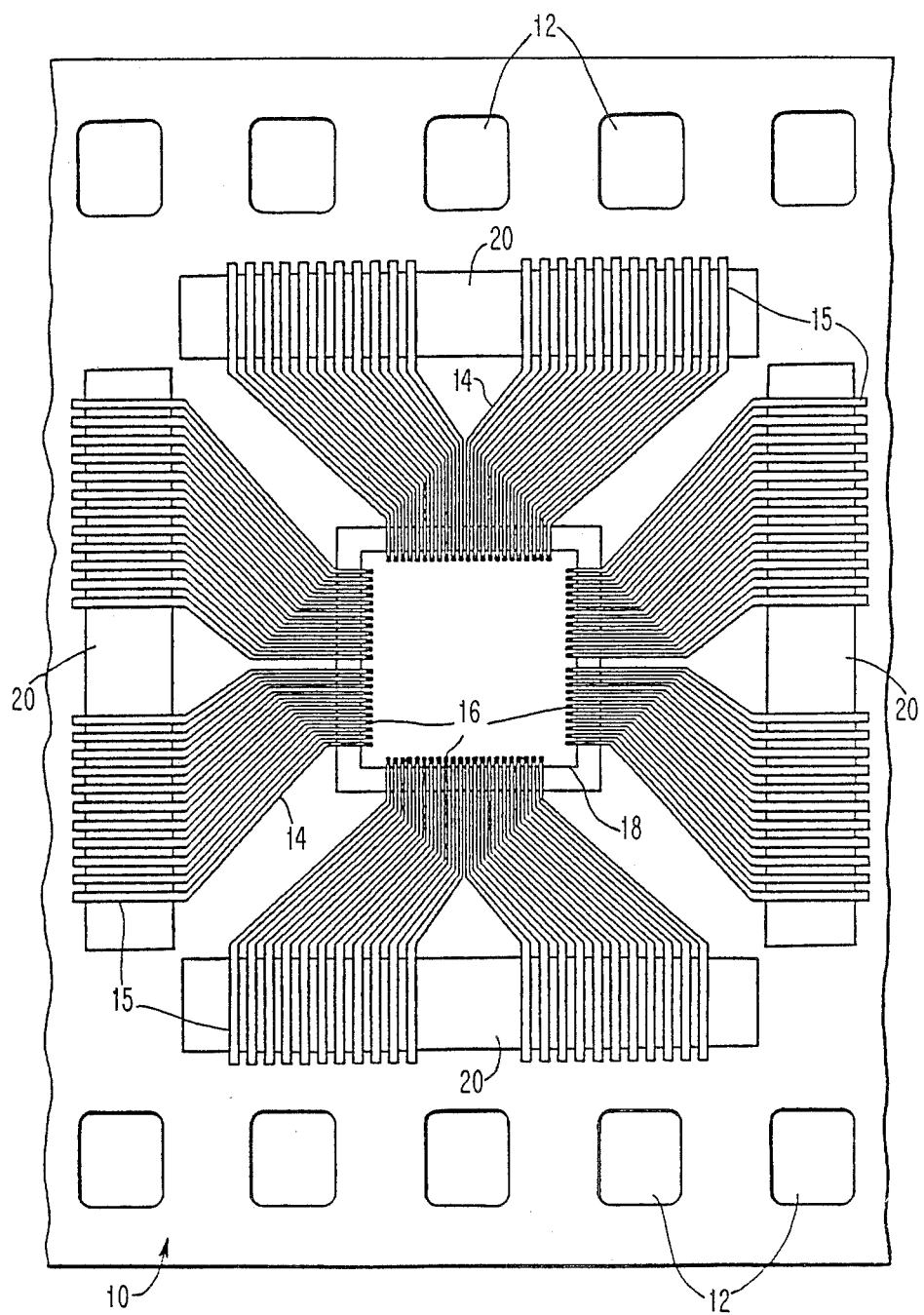
FIG. 1 is a plan view of a prior art carrier tape with sets of beam leads adapted to be subsequently bonded to a semi-conductor chip and to an underlying circuit board.

Referring now to FIG. 1, a plan view is shown of a tape carrier with affixed beam leads. Tape carrier 10 has sprocket holes 12 formed therein and carries a plurality of conductive beam leads 14 thereon. Tape carrier 10 is comprised of a plastic film which has suitable dimensional stability and is mechanically indexed through sprocket interactions with sprocket holes 12. Copper is generally used for conductors 14 with the contact portions thereof being overplated with a thin layer of gold. The plastic film in the areas beneath the outer bond portions 15 of leads 14 has been removed to enable a subsequent bonding to an underlying circuit board substrate.

In operation, tape carrier 10 is indexed to a station where a semi-conductor chip 18 is positioned on the tape so that its contact pads register with inner bond portions 16. A bonding head is then lowered to cause a bond to be made between inner bond portions 16 and input/output pads on semi-conductor chip 18. Subsequently, the outer segments of tape carrier 10 are severed from the conductor-carrying portions and then bonds are made between an underlying circuit board's conductor pads and the outer bond portions 15 of conductors 14. It should thus be noted that physical support for the beam lead/chip structure is via the bonds which exist between outer bond portions 15 of conductors 14 and the underlying connector pads on the circuit board.

Figure 2:
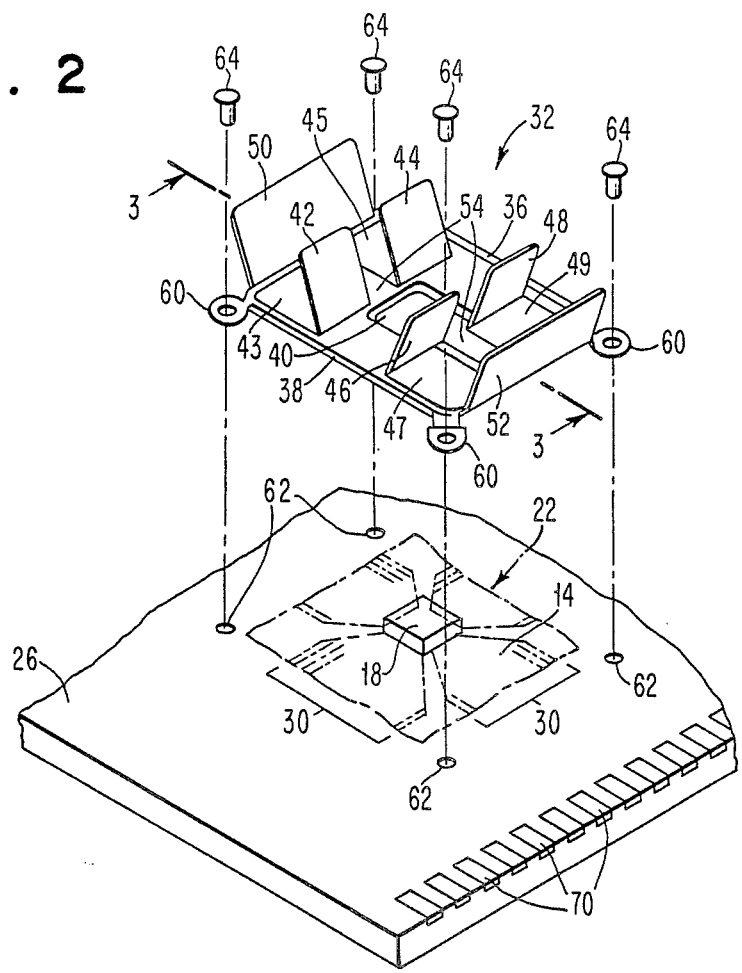
FIG. 2 is an exploded, perspective view of the invention.

Turning now to FIG. 2, there is shown at 22, a perspective view of chip 18 after it has been emplaced on conductors 14, which have, in turn, been bonded to circuit board 26 at conductor pads 30.

Subsequent to the emplacement of chip 18 and its connection to underlying conductors on circuit board 26, heat sink 32 is put in place. Heat sink 32 is preferably fabricated from a thin sheet of copper, aluminum or other suitable material that meets the mass and thermal criteria. If copper sheet is used, it may be coated with a black oxide to improve its thermal performance.

There are a number of inter-related considerations of importance to heat sink 32. Among them are: (a) the heat sink should have optimum heat dissipation capability; (b) it should be able to withstand sudden accelerations and de-accelerations without damage to the package; (c) it should be able to withstand flexure of the underlying circuit board; and (d) its mass should be as small as possible so as to minimize its cost and weight.

Figure 7:
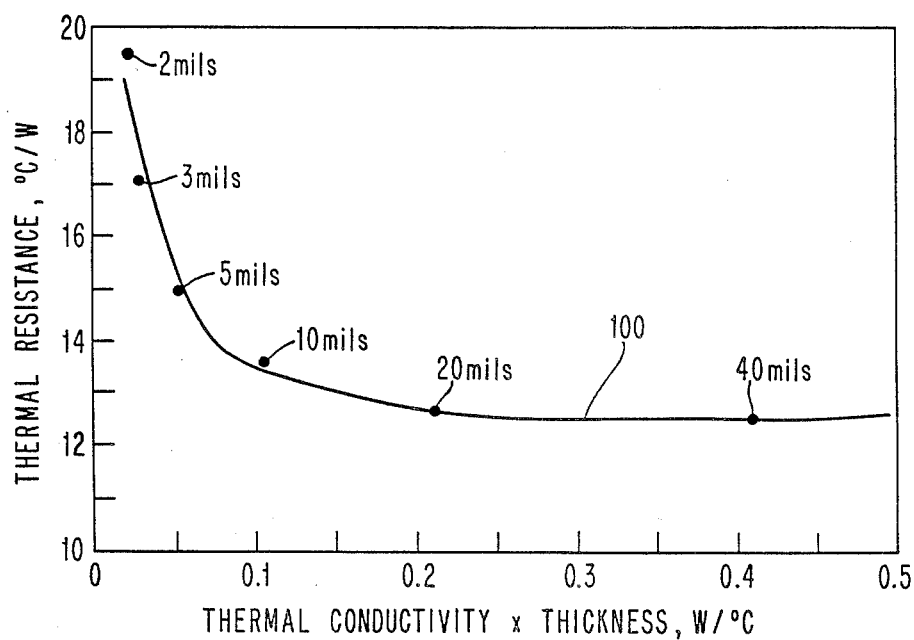
FIG. 7 is an experimentally derived plot of a heat sink's thermal resistance vs its thermal conductivity multiplied by thickness of the heat sink's material.

The material from which the heat sink is fabricated must not be so thin as to be too fragile or create excessive thermal resistance. Nor should its material be so thick as to result in unacceptable weight and cost. Referring to FIG. 7, there is shown, for a 3.5 cm by 7.0 cm copper, flat plate heat sink, an empirically developed plot of thermal resistance vs thermal conductivity multiplied by the heat sink's thickness. Thermal resistance is plotted along the vertical coordinate and is equal to the temperature of the heat sink less the ambient temperature, divided by the power dissipated in the chip, (in this case 2 watts). The heat sinks tested were fabricated from copper sheet which varied in thickness from 2 mils to 40 mils. The results are depicted by curve 100.

Curve 100 shows that the thermal resistance of the heat sink increases rapidly when its thickness is less than 5 mils. By contrast, when its thickness exceeds approximately 20 mils, there is little improvement in its thermal conductivity. This data indicates that the use of copper sheet, in a range of thicknesses between approximately 5-25 mils, provides optimum thermal conductivity characteristics.

It has been determined that by utilizing thin copper sheet with a thickness in the range of approximately 5-25 mils (with the optimum thickness being approximately 20 mils), a heat sink is produced which is able to dissipate 2 watts from an underlying chip; which exhibits its sufficient strength and flexibility in both its structure and interconnections with the circuit board to withstand without damage, circuit board flexures and rapid accelerations and de-accelerations. A heat sink to be described below, has been constructed of 20 mil copper, 3.5 by 7.0 cm in planar dimension and weighs approximately 11.4 grams. Such a heat sink is able to convectively dissipate 2 watts and meets the aforestated physical abuse characteristics.

Figure 3:
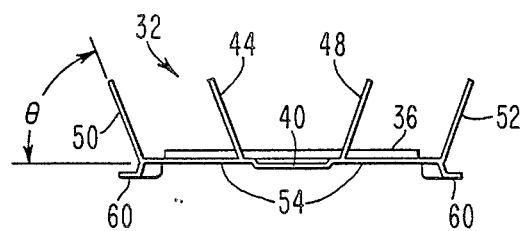
FIG. 3 is a side view of the heat sink of this invention taken along line 3—3 in FIG. 2.

Referring to FIG. 2 in conjunction with FIG. 3, heat sink 32 is constructed from thin copper sheet material which is formed into a pan-like depression having stabilizing rails 36 and 38 along its extended dimension. A further pan-like depression 40 is formed in its major planar surface and acts to bear upon the exposed surface of chip 18 when heat sink 32 is in place. It is through the bottom most portion of pan shaped area 40 that the major heat transfer occurs into heat sink 32. Four bent-up fins 42, 44, 46 and 48 are punched out of the major planar surface of heat sink 32 and provide apertures 43, 45, 47 and 49 which expose the underlying circuit board 26 and create convective air passages for the underlying structure. During processing, (after chip and heat sink placement and bonding) it is often desirable to wash the assembly in a solvent. Apertures 43, 45, 47 and 49 further enable the solvent to better access otherwise hidden portions of the chip and its associated conductors.

At either extremity of heat sink 32 are two major fins 50 and 52 each of which is preferably bent at an angle identical to the angle of fins 42, 44, and 46, 48 respectively. Heat transfer arms 54 remain in the planar surface of heat sink 32 and provide conductive heat transfer away from pan member 40 to each of fins 50 and 52.

Figure 4:
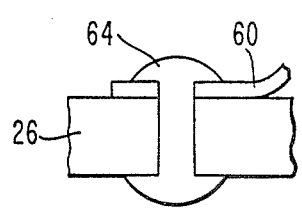
FIGS. 4, 5, and 6 indicate various methods for securing the heat sink of this invention to an underlying circuit board.

Each corner of heat sink 32 is provided with a tab 60 which includes an aperture which matches with holes 62 in circuit board 26. Resilient fasteners 64 extend through the apertures in tabs 60 and thence through holes 62 and are secured on the other side thereof of circuit board 26 by any conventional means. For instance, assuming that fasteners 64 are comprised of a thermo-plastic polymer, when they are extended through holes 62, a heated anvil may come in contact with each one causing its extended portion which projects below circuit board 26 to expand and hold the fastener in place (as is shown in FIG. 4). It is important that fasteners 64 be sufficiently resilient to enable some flexure to occur in tabs 60 and heat sink 32 when circuit board 26 is flexed. For instance, circuit board 26 may be substantially flexed when its edge contacts 70 are inserted into a connector (not shown).

Figure 5:
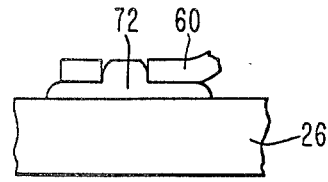

An alternative attachment method is shown in FIG. 5 wherein a quantity of thermo-plastic adhesive 72 is emplaced beneath tabs 60 on circuit board 26 and then tabs 60 placed thereover and compressed. An adhesive is acceptable which remains malleable after curing and allows for some movement between tabs 60 and board 26. One such material is RTV Silicone Cement produced by the General Electric Company, Waterford, New York. A preferred material for fasteners 64 is nylon but other flexible polymers are also acceptable.

Figure 6:
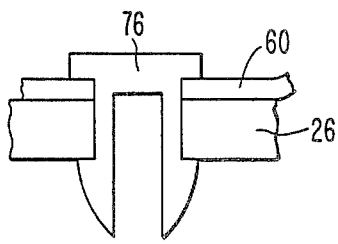

Still another attachment method may employ flexible push-in snap fasteners 76 as shown in FIG. 6.

It is further to be noted that fins 42, 44, and 50 are oriented at an angle Θ from the planar surface where Θ is preferably an acute angle of approximately 70°. Similarly, fins 46, 48 and 52 are oriented at the same angle but with a mirror image. This enables heat sink 32 to be stacked during manufacture and to be automatically fed from a magazine in an assembly machine.

When heat sink 32 is emplaced over chip 18, it is preferable first to place a thin coating of a thermally conductive epoxy onto the upper surface of chip 18 so that it securely bonds with the lower surface of pan portion 40. The epoxy is preferably mixed with a zinc oxide filler. One example of a commercially available epoxy suitable for this purpose is Scotchcast, manufactured by the 3M Company, Minneapolis, Minn. It should be noted further that pan portion 40 maintains an offset between the heat sink and the underlying conductors emanating from the chip, thus preventing short circuits.

In summary, the mass of heat sink 32 is so adjusted that it dissipates the desired amount of heat, and will not, when subjected to a sudden acceleration or de-acceleration, cause ruptures of the conductors which connect the chip to an underlying substrate. Furthermore, its own flexibility plus the provision of resilient "hold downs" at the corners of the heat sink prevent it from being "popped" off of the circuit board in the event of flexure thereof.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An integrated circuit assembly comprising:
   a flexible substrate having a plurality of conductive pads;
   integrated circuit chip means provided with a plurality of conductive pads;
   film-supported conductor means for connecting said conductive pads on said chip means to the conductor pads on said substrate; and
   convective heat sink means thermally mounted to said chip means, said heat sink means formed from a folded thin metal sheet and including a plurality of mounting points connected to said flexible substrate.

2. The invention of claim 1, wherein said conductor means are beam leads partially supported by a flexible carrier, said beam leads providing both electrical connections and physical support between said chip means and said substrate.

3. The invention of claim 2, wherein said mounting points are connected to said substrate by resilient means.

4. The invention of claim 3, wherein said chip is thermally connected to said convective heat sink means and the mass of said convective heat sink means is insufficient to cause damage to said beam leads when said circuit assembly is subjected to expected accelerations and de-accelerations.

5. The invention of claim 4, wherein the thickness of said folded thin metal sheet is within the range of from approximately 5 mils to 25 mils.

6. The invention of claim 5, wherein said convective heat sink means is pan-shaped with a major planar surface and has a centrally located depressed portion in said major planar surface which is positioned to bear upon said integrated circuit chip means.

7. The invention of claim 6, wherein said convective heat sink means further includes a plurality of raised fins extending away from said major planar surface.

8. The invention of claim 7, wherein said plurality of raised fins include two pair of spaced apart minor fins, punched and bent up from said planar surface, leaving openings in said planar surface and positioned on either side of said depressed portion, metal arms remaining between said openings which act as heat conductors to two additional major fins extending upwardly from the extremities of said heat sink means.

9. The invention of claim 8, wherein said two major fins are continuous across the width of the convective heat sink means.

10. The invention of claim 9, further including a thermally conducting insulating cement interposed between said chip means and said depressed portion of said heat sink means.

11. The invention of claim 10, wherein one said major fin and a pair of minor fins are oriented at the same acute angle from said major planar surface and the other major fin and pair of minor fins are oriented at the complementary angle from said major planar surface to enable stacking of said heat sink means.

* * * * *